US008987607B2

(12) United States Patent
Ozeki et al.

(10) Patent No.: US 8,987,607 B2
(45) Date of Patent: Mar. 24, 2015

(54) CONDUCTIVE PARTICLE, AND ANISOTROPIC CONDUCTIVE FILM, BONDED STRUCTURE, AND BONDING METHOD

(75) Inventors: Hiroki Ozeki, Tochigi (JP); Tomoyuki Ishimatsu, Tochigi (JP); Reiji Tsukao, Tochigi (JP)

(73) Assignee: Dexerials Corporation, Shinagawa, Ku, Tokyo (JP)

( * ) Notice: Subject to any disclaimer, the term of this patent is extended or adjusted under 35 U.S.C. 154(b) by 273 days.

(21) Appl. No.: 13/552,858

(22) Filed: Jul. 19, 2012

(65) Prior Publication Data

US 2012/0279781 A1 Nov. 8, 2012

Related U.S. Application Data

(63) Continuation of application No. PCT/JP2011/068915, filed on Aug. 23, 2011.

(30) Foreign Application Priority Data

Aug. 31, 2010 (JP) ................................ 2010-193790

(51) Int. Cl.

| | |
|---|---|
| ***B05D 5/12*** | (2006.01) |
| ***H05K 1/02*** | (2006.01) |
| ***H01B 1/22*** | (2006.01) |
| *H01R 4/04* | (2006.01) |
| *H01R 13/03* | (2006.01) |

(52) U.S. Cl.

CPC .. *H01B 1/22* (2013.01); *H01R 4/04* (2013.01); *H01R 13/03* (2013.01)

USPC ......................... 174/259; 174/257; 427/126.1

(58) Field of Classification Search

CPC ............... H01B 1/14; H01B 1/16; H01B 1/18

USPC ........................................ 174/257; 427/126.1

See application file for complete search history.

(56) References Cited

U.S. PATENT DOCUMENTS

| | | | | |
|---|---|---|---|---|
| 5,438,223 | A | 8/1995 | Higashi et al. | |
| 7,491,445 | B2 | 2/2009 | Ishida | |
| 2004/0061240 | A1 * | 4/2004 | Seko | 257/782 |

(Continued)

FOREIGN PATENT DOCUMENTS

| | | | |
|---|---|---|---|
| JP | 5-258790 | A | 10/1993 |
| JP | 2006-228475 | A | 8/2006 |

(Continued)

OTHER PUBLICATIONS

International Search Report (PCT/ISA/210) issued on Oct. 11, 2011, by the Japanese Patent Office as the International Searching Authority for International Application No. PCT/JP2011/068915.

(Continued)

*Primary Examiner* — Jeremy C Norris

(74) *Attorney, Agent, or Firm* — Buchanan, Ingersoll & Rooney PC

(57) ABSTRACT

To provide a conductive particle, which contains a core particle, and a conductive layer formed on a surface of the core particle, where the core particle is formed of a resin, or a metal, or both thereof, and the conductive layer contains a phosphorus-containing hydrophobic group at a surface thereof.

20 Claims, 2 Drawing Sheets

(56) References Cited

U.S. PATENT DOCUMENTS

| | | | | |
|---|---|---|---|---|
| 2004/0109943 | A1* | 6/2004 | Matsushima et al. | 427/212 |
| 2007/0012899 | A1* | 1/2007 | Lee et al. | 252/500 |
| 2009/0288680 | A1* | 11/2009 | Kaneko et al. | 134/4 |
| 2010/0327232 | A1* | 12/2010 | Yamamoto et al. | 252/500 |
| 2012/0090882 | A1 | 4/2012 | Ishimatsu et al. | |

FOREIGN PATENT DOCUMENTS

| | | | |
|---|---|---|---|
| JP | 2006-302716 | A | 11/2006 |
| JP | 2008-222785 | A | 9/2008 |
| JP | 2009-029862 | A | 2/2009 |
| JP | 4235227 | B2 | 3/2009 |
| JP | 2009-280790 | A | 12/2009 |
| JP | 2010-73681 | A | 4/2010 |
| JP | 2010-086664 | A | 4/2010 |
| JP | 2010-103080 | A | 5/2010 |
| JP | 2010-103081 | A | 5/2010 |
| TW | 274620 | | 4/1994 |
| TW | 200537528 | | 11/2005 |

OTHER PUBLICATIONS

Written Opinion (PCT/ISA/237) issued on Oct. 11, 2011, by the Japanese Patent Office as the International Searching Authority for International Application No. PCT/JP2011/068915.

Office Action issued on Dec. 10, 2013, by the Taiwanese Patent Office in corresponding Taiwan Patent Application No. 100131112, and an English Translation of the Office Action. (16 pages).

* cited by examiner

CONDUCTIVE PARTICLE, AND ANISOTROPIC CONDUCTIVE FILM, BONDED STRUCTURE, AND BONDING METHOD

CROSS-REFERENCE TO RELATED APPLICATION

This is a continuation of Application No. PCT/JP2011/068915, filed on Aug. 23, 2011.

BACKGROUND OF THE INVENTION

1. Field of the Invention

The present invention relates to conductive particles and a production method thereof, and to an anisotropic conductive film, a bonded structure and a bonding method using such conductive particles.

2. Description of the Related Art

To connect circuit members each other, such as a connection between a liquid crystal display device and a tape carrier package (TCP), a connection between a flexible printed circuit (FPC) and TCP, and a connection between a FPC and a printed circuit board, a circuit connecting material (e.g., anisotropic conductive film), in which conductive particles are dispersed in a binder resin, is used. In recent years, when a semiconductor silicon chip is mounted on a substrate, in order to connect circuit members to each, so-called "flip chip mounting" is employed in which the semiconductor silicon chip is directly bonded face down on the substrate without using a wire bond. In this flip chip mounting, circuit connecting materials, such as an anisotropic conductive adhesive, are used for connecting circuit members to each other.

The anisotropic conductive film generally contains a binder resin and conductive particles. As the conductive particles, for example, nickel (Ni) based conductive particles have been popular as hardness thereof is high, and a cost can be reduced compared to use of gold (Au) based conductive particles.

There is disclosed, as the nickel (Ni) based conductive particles, for example, conductive particles each containing a resin particle and a conductive layer which is formed on the resin particle and contains nickel or nickel alloy, where the conductive layer has a surface in which irregularities are formed with aggregates of cluster particles, and the conductive layer has a phosphorus content of 2% to 8% (see, for example, Japanese Patent Application Laid-Open (JP-A) No. 2006-302716).

Onto these conductive particles, however, surface modification has not be performed, and therefore the conductive particles have low corrosion resistance (moisture resistance), which leads to low connection reliability.

There is disclosed, as the nickel (Ni) based conductive particles, conductive particles each containing a resin particle, and a conductive layer formed on a surface of the resin particle, where the conductive layer contains an amorphous nickel plating layer having a phosphorus content of 10% to 18%, and a crystalline nickel plating layer having a phosphorus content of 1% to 8% (see, for example, Japanese Patent (JP-B) No. 4235227).

The amorphous structure in the conductive layer has low hardness, and no surface modification has been performed onto these conductive particles, and therefore the conductive particles have low corrosion resistance, which leads to low connection reliability.

There is disclosed, as the nickel (Ni) based conductive particles, conductive particles each containing a resin particle a surface of which is covered with a multilayer conductive film in which a metal plating coating film containing nickel and phosphorus is provided on a surface of the resin particle, and a gold layer provided as an outermost surface of the multilayer conductive film, where the metal plating composition of the metal plating coating film in the region that is from the side of the base particle to 20% or less of the thickness of the metal plating coating film contains phosphorus in an amount of 10% by mass to 20% by mass, and the metal plating composition of the metal plating coating film in the region that is from the top surface of the metal plating coating film to 10% or less of the thickness of the metal plating coating film contains phosphorus in an amount of 1% by mass to 10% by mass (see, for example, JP-A No. 2006-228475).

These conductive particles however have portions having low hardness in their conductive layers, and are not subjected to a surface treatment. Therefore, corrosion resistance thereof is low, which leads to low connection reliability.

There are disclosed, as the nickel (Ni)-based conductive particles, conductive particles each containing a core particle, and a conductive layer formed on a surface of the core particle, where the core particle is a nickel particle, and the conductive layer is a nickel plating layer at surface of which a phosphorus concentration is 10% by mass or lower, and has the average thickness of 1 nm to 10 nm (see, for example, JP-A No. 2010-73681).

However, a surface modification is not performed on these conductive particles, and the corrosion resistance thereof is low, which leads to low connection reliability.

There is disclosed, as the nickel (Ni)-based conductive particles, conductive particles containing an outermost layer having a metal surface constituted of metal atoms including gold and/or palladium, and a nickel layer provided below the outermost layer, where the metal surface is covered with surface modification groups including a sulfur atom at a terminal thereof (see, for example, JP-A No. 2009-280790).

Although a surface treatment is performed on these conductive particles, corrosion resistance of the conductive particles is not improved, and hence having a problem that connection reliability is low.

Accordingly, there are strong demands for conductive particles, which can prevent oxidation of conductive layers, and improve corrosion resistance, without reducing the hardness of the conductive layer.

SUMMARY OF THE INVENTION

The present invention aims to solve the aforementioned various problems in the art, and to achieve the following object. An object of the present invention is to provide conductive particles, which can prevent oxidation of conductive layers, and improve corrosion resistance without reducing the hardness of the conductive layer, and a production method thereof, as well as providing an anisotropic conductive film, a bonded structure, and a bonding method using such the conductive particles.

Means for solving the aforementioned problems are as follows:

<1> A conductive particle, containing:

a core particle; and a conductive layer formed on a surface of the core particle, wherein the core particle is formed of a resin, or a metal, or both thereof, and the conductive layer contains a phosphorus-containing hydrophobic group at a surface thereof.

<2> A conductive particle, containing:

a core particle; and a conductive layer formed on a surface of the core particle, wherein the core particle is formed of a resin, or a metal, or both thereof, and the conductive layer has a surface hydrophobic treated with a phosphorus-containing compound.

<3> The conductive particle according to <1> or <2>, wherein the core particle is a resin particle, and the conductive layer is a nickel plating layer.

<4> A method for producing conductive particles, each containing a core particle and a conductive layer formed on a surface of the core particle, the method containing:

treating a surface of the conductive layer with a phosphorus-containing compound to give hydrophobicity, wherein the core particle is formed of a resin, or a metal, or both thereof.

<5> The method according to <4>, wherein the conductive layer has a phosphorus concentration of 10% by mass or lower before the hydrophobic treatment with the phosphorus-containing compound.

<6> The method according to <5>, wherein the conductive layer has a phosphorus concentration of 2.5% by mass to 7.0% by mass before the hydrophobic treatment with the phosphorus-containing compound.

<7> The method according to any one of <4> to <6>, wherein the phosphorus-containing compound is a phosphoric acid compound.

<8> An anisotropic conductive film, containing:

conductive particles; and a binder resin, wherein the conductive particles are each the conductive particle as defined in any one of <1> to <3>.

<9> The anisotropic conductive film according to <8>, further containing at least one selected from the group consisting of a phenoxy resin, a polyester resin, and a urethane resin.

<10> The anisotropic conductive film according to <8> or <9>, further containing a curing agent.

<11> The anisotropic conductive film according to any one of <8> to <10>, further containing a silane coupling agent.

<12> A bonded structure, containing:

a first circuit member containing an electrode;

a second circuit member containing an electrode, provided so as to face the first circuit member; and the anisotropic conductive film as defined in any one of <8> to <11>, provided between the first circuit member and the second circuit member, wherein the electrode of the first circuit member and the electrode of the second circuit member are electrically connected via the conductive particles.

<13> The bonded structure according to <12>, wherein the first circuit member is a flexible circuit board, and the second circuit member is a printed wiring board.

<14> A bonding method, containing:

bonding an anisotropic conductive film, which contains conductive particles and a binder resin, with a first circuit member containing an electrode, or a second circuit member containing an electrode;

aligning the first circuit member and the second circuit member for positioning; and electrically connecting the electrode of the first circuit member and the electrode of the second circuit member via the conductive particles, wherein the anisotropic conductive film is the anisotropic conductive film as defined in any one of <8> to <11>.

<15> The bonding method according to <14>, wherein the first circuit member is a flexible circuit board, and the second circuit member is a printed wiring board.

The present invention can solve the aforementioned various problems in the art, and achieve the following object. The present invention provides conductive particles, which can prevent oxidation of conductive layers, and improve corrosion resistance without reducing the hardness of the conductive layer, and a production method thereof, as well as providing an anisotropic conductive film, a bonded structure, and a bonding method using such the conductive particles.

Figure 1:
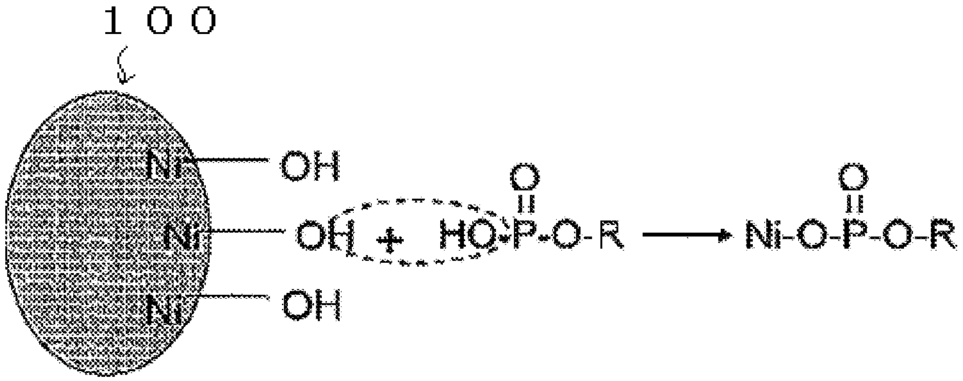
FIG. 1 is a schematic diagram for explaining a hydrophobic treatment performed on the conductive particles of the present invention.

DETAILED DESCRIPTION OF THE INVENTION (Conductive Particles and Production Method Thereof)

The conductive particle of the present invention contains at least a core particle, and a conductive layer, and may further contain protrusions, as desired.

The conductive particle of the present invention may also be used as a group of particles, which may be referred to as "conductive particles of the present invention" hereinafter.

In the present specification, the term "conductive" denotes electrical conductivity, unless otherwise stated.

<Core Particle>

The core particle is appropriately selected depending on the intended purpose without any restriction, provided that it is formed of at least either a resin or a metal, and examples thereof include a resin particle, and a metal particle. The core particle may have a single layer structure, or a laminate structure.

—Resin Particle—

The resin particle is appropriately selected depending on the intended purpose without any restriction.

A shape of the resin particle is appropriately selected depending on the intended purpose without any restriction, but the shape thereof preferably is such that a surface of the resin particle has fine irregularities.

A structure of the resin particle is appropriately selected depending on the intended purpose without any restriction, and examples thereof include a single layer structure, and a laminate structure.

The number average particle diameter of the resin particles is appropriately selected depending on the intended purpose without any restriction, but it is preferably 1 μm to 50 μm, more preferably 2 μm to 20 μm, and even more preferably 5 μm to 10 μm.

When the number average particle diameter of the resin particles is smaller than 1 μm, or greater than 50 μm, a sharp particle size distribution may not be attained, which makes the resulting conductive particles unusable in terms of practical use in industrial productions. When the number average particle diameter of the resin particles is within the aforementioned even more preferable range, it is advantageous because excellent connection reliability can be attained.

Note that the number average particle diameter of the resin particles is measured, for example, by means of a particle size distribution analyzer (MICTOTRAC MT3100, manufactured by NIKKISO CO., LTD.).

A material of the resin particle is appropriately selected depending on the intended purpose without any restriction, and examples thereof include polyethylene, polypropylene, polystyrene, polyvinyl chloride, polyvinylidene chloride, polytetrafluoroethylene, polyisobutylene, polybutadiene, polyalkylene terephthalate, polysulfone, polycarbonate, polyamide, a phenol formaldehyde resin, a melamine formaldehyde resin, a benzoguanamine formaldehyde resin, a urea formaldehyde resin, (meth)acrylate polymers, divinylbenzene polymers, divinylbenzene-styrene copolymers, and divinylbenzene-(meth)acrylate copolymer. These may be used independently, or in combination.

Among them, (meth)acrylate polymers, divinylbenzene polymers, and divinylbenzene-based polymers are preferable.

In the present specification, the term "(meth)acrylate" denotes either methacrylate or acrylate, the (meth)acrylate may be crosslinked, or non-crosslinked, or a mixture thereof, as necessity.

—Metal Particle—

The metal particle is appropriately selected depending on the intended purpose without any restriction.

A shape of the metal particle is appropriately selected depending on the intended purpose without any restriction, but the shape thereof includes a surface configuration having fine irregularities because a connection area increases, and therefore high current of electricity can be transmitted.

A structure of the metal particle is appropriately selected depending on the intended purpose without any restriction, and examples thereof include a single layer structure, and a laminate structure.

The number average particle diameter of the metal particles is appropriately selected depending on the intended purpose without any restriction, but it is preferably 1 μm to 50 μm, more preferably 2 μm to 20 μm, and even more preferably 5 μm to 10 μm.

When the number average particle diameter of the metal particles is smaller than 1 μm or greater than 50 μm, a sharp particle size distribution may not be attained, which makes the resulting conductive particles unusable in terms of practical use in industrial productions. When the number average particle diameter of the metal particles is within the aforementioned even more preferable range, it is advantageous because an indentation test can be performed after bonding PWB and FPC together.

Note that, the number average particle diameter of the metal particles is measured, for example, by means of a particle size distribution analyzer (MICTOTRAC MT3100, manufactured by NIKKISO CO., LTD.).

A material of the metal particle is appropriately selected depending on the intended purpose without any restriction, and examples thereof include gold, pure nickel, and impurity-doped nickel. The impurities are appropriately selected depending on the intended purpose without any restriction, and they may be organic materials, or inorganic materials. Examples thereof include phosphorus, boron, and carbon.

<Conductive Layer>

The conductive layer is appropriately selected depending on the intended purpose without any restriction, provided that it is formed on a surface of the core particle, and contains a phosphorous-containing hydrophobic group at a surface thereof. Examples thereof include a nickel plating layer, and a nickel/gold plating layer.

A method for plating to form the conductive layer is appropriately selected depending on the intended purpose without any restriction, and examples thereof include electroless plating, and sputtering.

—Phosphorus-Containing Hydrophobic Group—

The phosphorus-containing hydrophobic group is a group containing a phosphorus atom and C3 or higher hydrophobic group, and examples thereof include a group represented by the following general formula (1).

General Formula (1)

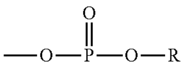

In the general formula (1) above, R is a C3 or higher alkyl group.

The hydrophobic group is appropriately selected depending on the intended purpose without any restriction, provided that it contains 3 or more carbon atoms, and examples thereof include an alkyl group (a long alkyl chain). Note that, the alkyl group (a long alkyl chain) may have a substituent, and may have a linear chain structure, or a branched chain structure, but it is preferably an unsubstituted linear-chain alkyl group.

The number of carbon atoms in the alkyl group (a long alkyl chain) is appropriately selected depending on the intended purpose without any restriction, provided that it is 3 or greater, but it is preferably 3 to 16, more preferably 4 to 12.

When the number of carbon atoms is less than 3, a surface of the resulting conductive particle tends to be easily oxidized. When the number thereof is greater than 16, connection resistance may become high. When the number of carbon atoms is within the aforementioned more preferable range, excellent connection reliability can be attained.

Specific examples of the phosphorus-containing hydrophobic group are appropriately selected depending on the intended purpose without any restriction, but the examples include a phosphoric acid ester group.

The introduction of the phosphorus-containing hydrophobic group to the conductive layer can be confirmed with a presence of either a phosphoric atom or an ester bond at the surface of the conductive layer, which is measured by XPS, TOF-SIMS, or IR, or by observing a cross-section thereof by TEM.

The degree of crystallinity of the conductive layer increases, as the phosphorus concentration of the conductive layer decreases. Accordingly, the conductivity thereof increases, hardness thereof increases, and surfaces of the resulting conductive particles are less likely to be oxidized. When the phosphorus concentration of the conductive layer is low, high connection reliability in the connection between circuit members via the conductive particles can be attained. When the phosphorus concentration of the conductive layer is low, however, the conductive layer tends to be ionized, which lowers moisture resistance.

Accordingly, a phosphorus-containing hydrophobic group is introduced to a surface of the conductive layer to maintain the phosphorus concentration of the conductive layer low, but the phosphorus concentration at the surface of the conductive layer high (phosphorus is distributed locally to the surface of the conductive layer). As a result, the conductive layer is prevented from being deteriorated (a hardness thereof is lowered) and oxidized, and prevention of the oxidation of surfaces of the conductive particles is further enhanced. In addition, corrosion resistance (moisture resistance) of the conductive particles can be improved.

A phosphoric concentration of the conductive layer before the hydrophobic treatment with the phosphorus-containing compound is appropriately selected depending on the intended purpose without any restriction, but it is preferably 10% by mass or lower, more preferably 2.5% by mass to 7.0% by mass.

The conductive layer may have a gradient in the phosphorus concentration therein. For example, there is no problem even when the phosphorus concentration of the conductive layer at the side of the core particle is 15% by mass, as long as the phosphorus concentration of the conductive layer is 10% by mass or lower.

When the phosphorus concentration of the conductive layer is 10% by mass or lower before the hydrophobic treatment with the phosphorus-containing compound, the electric conductivity and hardness of the conductive layer are high, and the resulting conductive particle maintains excellent connection reliability over a long period with respect to an electrode (wiring) to which an oxide film has been provided. When the phosphorus concentration of the conductive layer is higher than 10% by mass before the hydrophobic treatment with phosphorus-containing compound, spreading properties thereof are enhanced, and therefore connection resistance may not be attained with an electrode (wiring) to which an oxide film has been provided. When the phosphorus concentration of the conductive layer before the hydrophobic treatment with the phosphorus-containing compound is within the aforementioned more preferable range, it is advantageous because excellent connection reliability can be attained, and the storage stability of the conductive particle improves.

The phosphorus concentration of the surface of the conductive layer which has been hydrophobic-treated with the phosphorus-containing compound (the surface of the conductive layer which has been treated with the below-described phosphorus-containing compound to give hydrophobicity) is appropriately selected depending on the intended purpose without any restriction, but it is preferably 0.5% by mass to 10% by mass, more preferably 1% by mass to 8% by mass.

When the phosphorus concentration of the surface of the conductive layer is lower than 0.5% by mass, the crystallinity of the conductive layer is excessively high. When the phosphorus concentration of the surface of the conductive layer is higher than 10% by mass, the conductive layer may be easily oxidized. When the phosphorus concentration of the surface of the conductive layer is within the aforementioned more preferable range, it is advantageous because excellent connection reliability can be attained.

A method for adjusting the phosphorus concentration of the conductive layer is appropriately selected depending on the intended purpose without any restriction, and examples thereof include a method for controlling pH of a plating reaction, and a method for controlling a phosphoric acid concentration in a nickel-plating solution.

Among them, the method for controlling pH of the plating reaction is preferable, as the method has excellent control over the reaction.

Note that, the phosphorus concentration of the conductive layer, and the phosphorus concentration at the surface of the conductive layer can be measured, for example, by energy dispersion X-ray analysis instrument (FAEMAX-7000, manufactured by HORIBA, Ltd.).

The average thickness of the conductive layer is appropriately selected depending on the intended purpose without any restriction, but it is preferably 20 nm to 200 nm, and more preferably 50 nm to 150 nm.

When the average thickness of the conductive layer is less than 20 nm, the connection reliability may be degraded. When the average thickness of the conductive layer is greater than 200 nm, the particles tend to aggregate to each other due to plating, which tends to form large particles. When the average thickness of the conductive layer is within the aforementioned more preferable range, high connection reliability can be secured, and aggregation of Plated Particles can be avoided during the formation of a conductive layer, to thereby prevent formation of connected plated particles in which two to three particles are connected together, preventing occurrences of short circuit.

Moreover, the conductive particle having the nickel particle as the core particle can have a nickel plating layer, which can be formed as the conductive layer more thinly than the conductive layer formed on a resin particle used as the core particle of the conductive particle.

Note that, the average thickness of the conductive layer is a thickness obtained by randomly selecting and measuring each conductive layer of 10 conductive particles, for example, by polishing the cross-section thereof by means of a focused ion beam system (FB-2100, manufactured by Hitachi High-Technologies Corporation), and measuring by a transmission electron microscope (H-9500, manufactured by Hitachi High-Technologies Corporation), and obtaining arithmetic mean of the measurement values.

Figure 2:
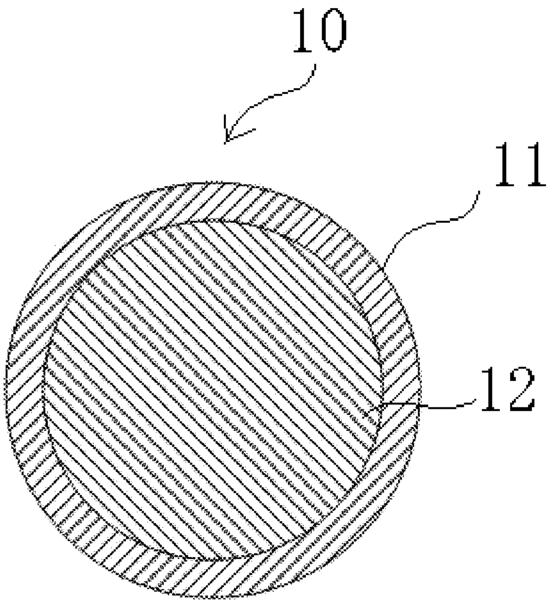
FIG. 2 is a cross-sectional view of the conductive particle of the present invention (part 1).
Figure 3:
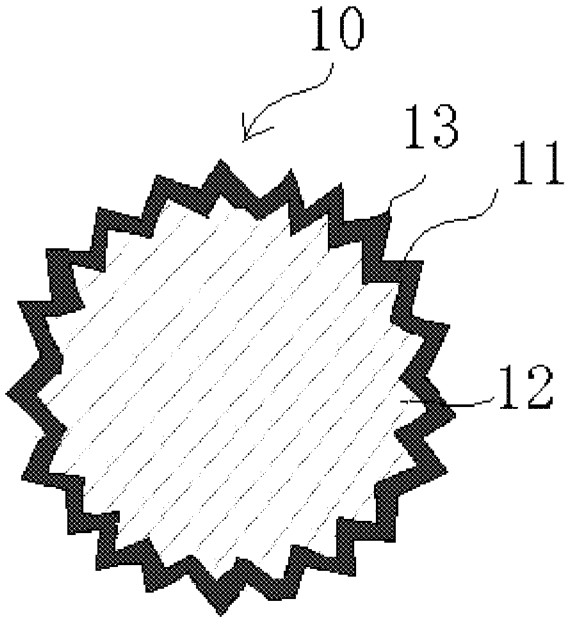
FIG. 3 is a cross-sectional view of the conductive particle of the present invention (part 2).

The conductive particle of the present invention will be explained with reference to FIGS. 2 and 3, hereinafter. As for the conductive particle 10, there are the particle containing a nickel particle 12, and a conductive layer 11 formed on a surface of the nickel particle 12 (FIG. 2), and the particle further containing protrusions 13 on a surface thereof (FIG. 3).

(Method for Producing Conductive Particles)

The method for producing conductive particles of the present invention contains at least a hydrophobic treatment step.

The method for producing conductive particle is a method for producing conductive particles each containing a core particle, and a conductive layer formed on a surface of the core particle.

The core particle is formed of a resin, a metal, or both thereof.

The core particle includes, for example, the core particle exemplified in the description of the conductive particle of the present invention.

The conductive layer includes, for example, the conductive layer exemplified in the description of the conductive particle of the present invention.

<Hydrophobic Treatment Step>

The hydrophobic treatment step is treating a surface of the conductive layer with a phosphorus-containing compound to give hydrophobicity.

—Phosphorus-Containing Compound—

The phosphorus-containing compound is not particularly limited as long as it contains phosphorus, and examples thereof include a phosphoric acid compound.

The phosphoric acid compound is appropriately selected depending on the intended purpose without any restriction, and examples thereof include a surfactant containing a hydroxyl group and an alkyl group at a terminal thereof.

For example, as illustrated in FIG. 1, the surfactant induces a dehydration condensation reaction by which the terminal hydroxyl group and a hydrogen atom in a hydroxyl group at a surface of a nickel plated particle 100 are detached, to thereby introduce an alkyl group (a long alkyl chain) R to the surface of the nickel plated particle 100, which is a hydrophobic treatment (which gives water-proof properties).

A number of carbon atoms in the alkyl group (a long alkyl chain) are appropriately selected depending on the intended purpose without any restriction, but it is preferably 3 to 16, more preferably 4 to 12.

When the number of carbon atoms is less than 3, a surface of the resulting conductive particle may be easily oxidized. When the number thereof is greater than 16, connection resistance may become high. When the number of carbon atoms is within the aforementioned more preferable range, excellent connection reliability can be attained.

—Hydrophobic Treatment—

The hydrophobic treatment is appropriately selected depending on the intended purpose without any restriction, provided that it contains treating a surface of the conductive layer with a phosphorus-containing compound.

In the present invention, only the phosphorus concentration of the surface of the conductive layer can be made high (phosphorus is locally provided to the surface of the conductive layer) by subjecting the surface of the conductive layer to a hydrophobic treatment with the phosphorus-containing compound, while keeping the total phosphorus concentration of the conductive layer low. Since the phosphorus concentration of the conductive layer is maintained low, the conductive layer is prevented from being deteriorated (reducing the hardness of the conductive layer) to thereby be oxidized. Since only the phosphorus concentration of the surface of the conductive layer is made high (phosphorus is locally provided to the surface of the conductive layer), the prevention of oxidation of the surface of the conductive particle is further improved. By introducing a hydrophobic group contained in the phosphorus-containing compound to the surface of the conductive layer, corrosion resistance can be improved.

A substituting rate of the phosphoric acid ester compound relative to the total hydroxyl groups on a surface of the conductive layer to which the hydrophobic treatment has been performed with the phosphoric acid compound is appropriately selected depending on the intended purpose without any restriction.

(Anisotropic Conductive Film)

The anisotropic conductive film of the present invention contains at least the conductive particles of the present invention, and a binder resin, preferably a curing agent, a resin, a silane coupling agent, and may further contain appropriately selected other components, as desired.

<Binder Resin>

The binder resin is appropriately selected depending on the intended purpose without any restriction, provided that the binder resin contains an epoxy resin and/or an acrylate resin. The binder resin is preferably a thermoset resin, a photocuring resin, or the like. Note that, in the case where the binder resin is a thermoplastic resin, the binder resin cannot securely include conductive particles therein, degrading the connection reliability.

Specific examples of the binder resin include an epoxy resin, and an acrylate resin.

—Epoxy Resin—

The epoxy resin is appropriately selected depending on the intended purpose without any restriction, and examples thereof include a bisphenol A epoxy resin, a bisphenol F epoxy resin, a novolak epoxy resin, modified epoxy resins thereof, and an alicyclic epoxy resin. These may be used independently, or in combination.

—Acrylate Resin—

The acrylate resin is appropriately selected depending on the intended purpose without any restriction, and examples thereof include methylacrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, and urethane acrylate. These may be used independently, or in combination.

Moreover, as the acrylate resin, methacrylates where the aforementioned acrylates are replaced with methacrylates may also be used, and these may be used independently, or in combination.

<Curing Agent>

The curing agent is appropriately selected depending on the intended purpose without any restriction, and examples thereof include a latent curing agent capable of being activated upon application of heat, and a latent curing agent capable of generating free radicals upon application of heat.

The latent curing agent of being activated upon application of heat is appropriately selected depending on the intended purpose without any restriction, and examples thereof include an anionic curing agent (e.g., polyamine, and imidazole), and a cationic curing agent (e.g., a sulfonium salt).

The latent curing agent capable of generating free radicals upon application of heat is appropriately selected depending on the intended purpose without any restriction, and examples thereof include organic peroxide, and an azo compound.

<Resin>

The resin is appropriately selected depending on the intended purpose without any restriction, provided that it is a solid at ordinary temperature (25° C.). Examples of the resin include a phenoxy resin, a polyester resin, and a urethane resin. The polyester resin is appropriately selected depending on the intended purpose without any restriction, and the polyester resin may be a saturated polyester resin, or an unsaturated polyester resin.

An amount of the solid resin at ordinary temperature is appropriately selected depending on the intended purpose without any restriction, but it is preferably 10% by mass to 80% by mass relative to the anisotropic conductive film.

When an amount of the solid resin at ordinary temperature is less than 10% by mass relative to the anisotropic conductive film, film forming properties become insufficient, which may cause blocking as the resulting anisotropic conductive film is formed into a film reel. When the amount thereof is greater than 80% by mass, the resulting film has low tackiness, and may fail to adhere to a circuit member.

<Silane Coupling Agent>

The silane coupling agent is appropriately selected depending on the intended purpose without any restriction, and examples thereof include an epoxy-based silane coupling agent, and an acryl-based silane coupling agent. As the silane coupling agent, an alkoxy silane derivative is typically used.

(Bonded Structure)

The bonded structure of the present invention contains a first circuit member, a second circuit member facing the first circuit member, and the anisotropic conductive film of the present invention provided between the first circuit member and the second circuit member, and an electrode of the first circuit member and an electrode of the second circuit member are electrically connected via the conductive particles.

—First Circuit Member—

The first circuit member is appropriately selected depending on the intended purpose without any restriction, and examples thereof include a flexible printed circuit (FPC) board, and a printed wiring board (PWB). Among them, the FPC board is preferable.

—Second Circuit Member—

The second circuit member is appropriately selected depending on the intended purpose without any restriction, and examples thereof include a flexible printed circuit (FPC) board, a chip on film (COF) board, TCP substrate, a printed wiring board (PWB), IC substrate, and a panel. Among them, the PWB is preferable.

(Bonding Method)

The bonding method of the present invention contains at least a film bonding step, an aligning step, and a connecting step, and may further contain appropriately selected other steps, as desired.

—Film Bonding Step—

The film bonding step is bonding the anisotropic conductive film of the present invention with a first circuit member or second circuit member.

—Aligning Step—

The aligning step is aligning the first circuit member or second circuit member to which the anisotropic conductive film has been bonded, and another circuit member (i.e., the second circuit member or first circuit member) to which the anisotropic conductive film has not been bonded, so that corresponding terminals (electrode) are faced each other, for positioning.

—Connecting Step—

The connecting step is electrically connecting the electrode of the first circuit member and the electrode of the second circuit member via the conductive particles.

—Other Steps—

Other steps are appropriately selected depending on the intended purpose without any restriction.

EXAMPLES

Examples of the present invention will be explained hereinafter, but these Examples shall not be construed as to limit the scope of the present invention in any way.

Production Example 1

<Production of Nickel Plated Particles A>

Styrene resin particles (Micropearl, manufactured by Sekisui Chemical Co., Ltd.) having the number average particle diameter of 3.8 μm were added to a thallium nitrate aqueous solution. To the resultant, a mixed solution of nickel sulfate (obtained from Sigma-Aldrich Japan), sodium hypophosphite (obtained from Sigma-Aldrich Japan), sodium citrate (obtained from Sigma-Aldrich Japan), and thallium nitrate (obtained from Sigma-Aldrich Japan), pH of which had been adjusted to the predetermined value with ammonia water or sulfuric acid, was added at the rate of 30 mL/min with stirring at 60° C., to thereby perform nickel plating. Thereafter, the plating liquid was filtered, and the resulting filtrate was washed with pure water, followed by drying at 80° C. by means of a vacuum drier, to thereby yield Nickel-Plated Particles A each having, as a conductive layer, a nickel plating layer having the average thickness of 101 nm, in which a phosphorus concentration of each conductive layer was 1.3% by mass.

<Evaluation of Conductive Particle>

The obtained conductive particles were sliced, and a cross-section of each particles was polished by means of a focused ion beam system (FB-2100, manufactured by Hitachi High-Technologies Corporation), and a thickness of the conductive layer was measured by means of a transmission electron microscope (H-9500, manufactured by Hitachi High-Technologies Corporation). The result is presented in Table 1.

Production Example 2

<Production of Nickel Plated Particles B>

Nickel Plated Particles B each having, as a conductive layer, a nickel plating layer having the average thickness of about 101 nm, in which a phosphorus concentration of each conductive layer was 2.6% by mass were produced in the same manner as in Production Example 1, provided that a mixing ratio between nickel sulfate, sodium hypophosphite, sodium citrate, and thallium nitrate in the mixed solution was changed.

Production Example 3

<Production of Nickel Plated Particles C>

Nickel Plated Particles C each having, as a conductive layer, a nickel plating layer having the average thickness of about 102 nm, in which a phosphorus concentration of each conductive layer was 4.8% by mass were produced in the same manner as in Production Example 1, provided that a mixing ratio between nickel sulfate, sodium hypophosphite, sodium citrate, and thallium nitrate in the mixed solution was changed.

Production Example 4

<Production of Nickel Plated Particles D>

Nickel Plated Particles D each having, as a conductive layer, a nickel plating layer having the average thickness of about 100 nm, in which a phosphorus concentration of each conductive layer was 6.9% by mass were produced in the same manner as in Production Example 1, provided that a mixing ratio between nickel sulfate, sodium hypophosphite, sodium citrate, and thallium nitrate in the mixed solution was changed.

Production Example 5

<Production of Nickel Plated Particles E>

Nickel Plated Particles E each having, as a conductive layer, a nickel plating layer having the average thickness of about 102 nm, in which a phosphorus concentration of each conductive layer was 9.8% by mass were produced in the same manner as in Production Example 1, provided that a mixing ratio between nickel sulfate, sodium hypophosphite, sodium citrate, and thallium nitrate in the mixed solution was changed.

Production Example 6

<Production of Nickel-Gold Plated Particles F>

Nickel-Gold Plated Particles F having, each having a nickel plating layer having the average thickness of 81 nm and a gold plating layer having the average thickness of 20 nm, in which a phosphorus concentration of each conductive layer was 0% by mass were produced in the same manner as in Production Example 1, provided that a surface of each Nickel Plated particle A was plated with gold by displacement plating.

Production Example 7

<Production of Nickel-Plated Particles G>

Gold-Plated Nickel Particles G each having, as a conductive layer, a plating layer having the average thickness of 101 mm, in which a phosphorus concentration of each conductive layer was 5.0% by mass were produced in the same manner as in Production Example 1, provided that the styrene resin particles were replaced with nickel particles (Nickel Powder 123, manufactured by NIKKO RICA CORPORATION) having the average particle diameter of 5.0 μm.

Examples 1 to 7

<Production of Water-Proof Treated Particles (Hydrophobic Particles) A to G>

A phosphoric acid ester-based surfactant (Phosphanol GF-199, manufactured by TOHO Chemical Industry Co., Ltd.) was neutralized with a sufficient amount of potassium hydroxide enough to completely neutralize the acid components of the surfactant, to thereby prepare a 10% by mass surfactant aqueous solution. A polypropylene (PP) container was charged with 2.5 g of the obtained 10% by mass surfactant aqueous solution, 50 g of water serving as a solvent, and 50 g of any of Nickel-Plated Particles A to E, G, or Nickel-Gold Plated Particles F, and the resulting mixture was stirred, and then dried, to thereby yield particles to which a water-proof treatment (hydrophobic treatment) had been performed (Water-Proof Treated Particles (Hydrophobic Particles) A to G).

Example 8

<Production of Water-Proof Treated Particles (Hydrophobic Particles) H>

Water-Proof Treated Particles (Hydrophobic Particles) H the conductive layer of which had the phosphorus concentration of 4.8% by mass before the water-proof treatment (hydrophobic treatment) and to each of which a plating layer having the average thickness of 102 mm had been formed were produced in the same manner as in Example 3, provided that the phosphoric acid ester-based surfactant (Phosphanol GF-199, manufactured by TOHO Chemical Industry Co., Ltd.) was replaced with a phosphoric acid ester surfactant (Phosphanol SM-172, manufactured by TOHO Chemical Industry Co., Ltd.).

<Measurement of Electric Conductivity of Particles>

The obtained Water-Proof Treated Particles (Hydrophobic Particles) A to H were subjected to the measurement of electric conductivity in the following manner.

—Measurement Method of Electric Conductivity—

A polypropylene (PP) container was washed with 60° C., and dried, and then the PP container was charged with 200 mL of ultrapure water, and 0.4 g of the conductive particles, followed by performing extraction for 10 hours at 100° C. Thereafter, the resultant was cooled for 1 hour, and was subjected to the filtration using filter paper. The resulting extract was subjected to the measurement of electric conductivity by means of an electric conductivity meter (CM-31P, manufactured by DKK-TOA CORPORATION). The results are presented in Table 2.

<Evaluation of Conductive Particle>

The measurement of the phosphorus concentration was performed by means of an energy-dispersive X-ray analyzer (FAEMAX-7000, manufactured by HORIBA, Ltd.). The results are presented in Table 1.

<Production of Bonding Materials 1 to 8>

In an adhesive of the following formula, any of Water-Proof Treated Particles (Hydrophobic Particles) A to H were dispersed to give a particle density of 10,000 particles per square millimeter. The resulting adhesive was applied onto a release PET film which had been treated with a silicone, followed by drying, to thereby obtain Bonding materials 1 to 8 each having a thickness of 20 μm.

| -Formula of Adhesive- | |
|---|---|
| Phenoxy resin (PKHC, of TOMOE ENGINEERING CO., LTD.) | 50 parts by mass |
| Radical polymerizable resin (EB-600, of DICEL-CYTEC COMPANY LTD.) | 45 parts by mass |
| Silane coupling agent (KBM-503, of Shin-Etsu Silicone) | 2 parts by mass |
| Hydrophobic silica (AEROSIL972, of EVONIK) | 3 parts by mass |
| Reaction initiator (PERHEXA C, of NOF CORPORATION) | 3 parts by mass |

<Production of Bonded Structures 1 to 8>

A COF (50 μm-pitched (Line/Space=1/1), Cu (8 μm-thick)-Sn plated, 38 μm-thick S'perflex base) for evaluation and an IZO coating glass (a glass sheet an entire surface of which had been coated with IZO, a thickness of a base: 0.7 mm) for evaluation were bonded together using any of the obtained Bonding materials 1 to 8 (anisotropic conductive films each prepared to have a thickness of 20 μm). At first, each Bonding materials 1 to 8 (20 μm-thick anisotropic conductive film) slit into a width of 1.5 mm was bonded to the IZO coating glass for evaluation, followed by positioning and temporality fixing the COF for evaluation thereon. The resulting laminate was bonded by pressure bonding using a 100 μm-thick Teflon (registered trademark) as a buffer material and a heating tool having a width of 1.5 mm, at 190° C. and at 4 MPa for 10 seconds, to thereby produce each of Bonded Structures 1 to 8.

<Measurement of Connection Resistance of Bonded Structures 1 to 8>

Each of Bonded Structures 1 to 8 was subjected to a measurement of connection resistance (Ω) with the application of electric current (1 mA), at the initial stage, and after a reliability test (treating for 500 hours at the temperature of 85° C., humidity of 85% RH) by means of a digital multimeter (Digital Multimeter 7555, manufactured by Yokogawa Electric Corporation) in accordance with a 4-terminal sensing method. The results are presented in Table 2.

<Storage Stability Test>

Each of water-proof treated particles (hydrophobic particles) A to H were placed in an oven the inner atmosphere of which had been set at 30° C. and 60% RH or 48 hours, to thereby carry out aging. Thereafter, using the resulting particles, Bonding materials 1 to 8 were produced, followed by producing Bonded Structures 1 to 8 using Bonding materials 1 to 8. The produced Bonded Structures 1 to 8 were each subjected to the measurement of connection resistance. The results are presented in Table 2.

<Production of Sample for Corrosion Evaluation>

As an evaluation base, a comb-shaped pattern glass (Line/Space=25/13, ITO wiring) for evaluation was used and it was covered with a bonding material. The bonding material was bonded to the pattern glass by pressure bonding using a 100 μm-thick Teflon (registered trademark) as a buffer material and a heating tool having a width of 1.5 mm, at 190° C. and at 4 MPa for 10 seconds, to thereby produce a corrosion evaluation sample.

<Evaluation of Corrosion Evaluation Sample>

The produced corrosion evaluation sample was exposed to the atmosphere having the temperature of 60° C. and the humidity of 95% RH, to which DC voltage of 15V was applied for 50 hours. Thereafter, whether or not corrosion of ITO wiring occurred was confirmed. The evaluation results are presented in Table 2.

Comparative Examples 1, 2, and 4

Bonding materials 9, 10, and 12, and Bonded Structures 9, 10, and 12 were obtained in the same manner as in Examples 1 to 8, provided that Water-Proof Treated Particles (Hydrophobic Particles) A to H were replaced with Nickel Plated Particles A, and G, and Nickel-Gold Plated Particle F, respectively. The measurement of electric conductivity of particles, measurement of particle hardness, measurement of connection resistance of the bonded structure, storage stability test, preparation of a corrosion evaluation sample, and corrosion evaluation were performed in the same manner as in Examples 1 to 8. The results are presented in Tables 1 and 2.

Comparative Example 3

Silane Coupling Treated Particles C each having, as a conductive layer, a plating layer having the average thickness of 102 nm, where a phosphorus concentration the conductive layer was 4.8% by mass, was obtained in the same manner as in Example 3, provided that the phosphoric ester-based surfactant (Phosphanol GF-199, manufactured by TOHO Chemical Industry Co., Ltd.) was replaced with a silane coupling agent (A-187, manufactured by Momentive Performance Materials Inc.). Using Silane Coupling Treated Particles C, Bonding material 11 and Bonded Structure 11 were obtained in the same manner as in Example 3. The measurement of electric conductivity of Silane Coupling Treated Particles C, measurement of hardness of Silane Coupling Treated Particles C, measurement of connection resistance of Bonded Structure 11, storage stability test, preparation of a corrosion evaluation sample, and corrosion evaluation were performed in the same manner as in Examples 1 to 8. The results are presented in Tables 1 and 2.

TABLE 1

| | Conductive particle | Core particle | Conductive layer (plating layer) | Thickness of conductive layer (nm) | Phosphorus concentration of conductive layer before hydrophobic treatment (% by mass) | Hydrophobic treatment |
|---|---|---|---|---|---|---|
| Ex. 1 | Water repellent particle A | Styrene resin particle | Ni | 101 | 1.3 | Yes |
| Ex. 2 | Water repellent particle B | Styrene resin particle | Ni | 101 | 2.6 | Yes |
| Ex. 3 | Water repellent particle C | Styrene resin particle | Ni | 102 | 4.8 | Yes |
| Ex. 4 | Water repellent particle D | Styrene resin particle | Ni | 100 | 6.9 | Yes |
| Ex. 5 | Water repellent particle E | Styrene resin particle | Ni | 102 | 9.8 | Yes |
| Ex. 6 | Water repellent particle F | Styrene resin particle | Ni/Au | 20 | — | Yes |
| Ex. 7 | Water repellent particle G | Ni particle | Ni | 101 | 5.0 | Yes |
| Ex. 8 | Water repellent particle H | Styrene resin particle | Ni | 102 | 4.8 | Yes |
| Comp. Ex. 1 | Au—Ni plated particle F | Styrene resin particle | Ni/Au | 20 | — | No |
| Comp. Ex. 2 | Ni plated particle A | Styrene resin particle | Ni | 101 | 1.3 | No |
| Comp. Ex. 3 | Silane coupling agent-treated particle C | Styrene resin particle | Ni | 102 | 4.8 | Yes (silane coupling agent treatment) |
| Comp. Ex. 4 | Ni plated particle G | Ni particle | Ni | 101 | 5.0 | No |

TABLE 2

| | Electric conductivity | Initial connection resistance (Ω) | | | Connection resistance after 85° C. 85% RH for 500 hr | | | Storage stability (after 30° C., 60% RH, for 48 hr) | Corrosion evaluation (number of corrosion occurrence/ | Comprehensive |
|---|---|---|---|---|---|---|---|---|---|---|
| | (μS/cm) | Max | Min | Ave | Max | Min | Ave | (Ω) | N = 5) | evaluation |
| Ex. 1 | 18 | 2.7 | 1.7 | 2.1 | 3.6 | 2.2 | 2.6 | 2.2 | 1/5 | B |
| Ex. 2 | 11 | 2.9 | 1.7 | 2.1 | 4.0 | 2.3 | 2.8 | 2.4 | 0/5 | A |
| Ex. 3 | 11 | 3.3 | 1.8 | 2.3 | 4.0 | 2.3 | 2.9 | 2.4 | 0/5 | A |

TABLE 2-continued

| | Electric conductivity | Initial connection resistance (Ω) | | | Connection resistance after 85° C. 85% RH for 500 hr | | | Storage stability (after 30° C., 60% RH, for 48 hr) | Corrosion evaluation (number of corrosion occurrence/ | Comprehensive |
|---|---|---|---|---|---|---|---|---|---|---|
| | (μS/cm) | Max | Min | Ave | Max | Min | Ave | (Ω) | N = 5) | evaluation |
| Ex. 4 | 10 | 3.6 | 1.8 | 2.5 | 4.2 | 2.5 | 3.2 | 2.5 | 0/5 | A |
| Ex. 5 | 9 | 5.0 | 2.5 | 3.8 | 6.3 | 3.9 | 4.9 | 3.6 | 0/5 | B |
| Ex. 6 | 14 | 10.6 | 4.7 | 6.8 | 19.5 | 7.9 | 10.2 | 6.9 | 0/5 | C |
| Ex. 7 | 14 | 2.3 | 1.6 | 1.9 | 6.0 | 3.5 | 4.3 | 2.4 | 0/5 | B |
| Ex. 8 | 15 | 3.6 | 2.0 | 2.6 | 5.7 | 2.9 | 3.5 | 3.0 | 0/5 | B |
| Comp. Ex. 1 | 22 | 10.1 | 4.5 | 6.6 | 20.5 | 8.2 | 10.7 | 7.1 | 1/5 | D |
| Comp. Ex. 2 | 44 | 3.5 | 1.8 | 2.5 | 9.8 | 4.7 | 6.8 | 5.1 | 4/5 | D |
| Comp. Ex. 3 | 30 | 3.8 | 2.2 | 2.7 | 7.5 | 4.2 | 5.4 | 4.3 | 3/5 | D |
| Comp. Ex. 4 | 32 | 4.6 | 2.3 | 3.2 | 12.2 | 6.9 | 8.5 | 6.5 | 3/5 | D |

It was found from the results of Tables 1 and 2 that Examples 1 to 8 using the conductive particles to which the hydrophobic treatment had been performed on the surface of the plating layer thereof with the phosphorus-containing compound had excellent results in electric conductivity, connection resistance (initial and after the reliability test), storage stability, and corrosion evaluation, compared to Comparative Examples 1, 2 and 4 using the conductive particles to which no hydrophobic treatment had been performed to the surface of the plating layer and Comparative Example 3 using the conductive particles to which a different hydrophobic treatment had been performed.

Further, it was found from the results of Tables 1 and 2 that Examples 2 to 4 using the conductive particles in which the phosphorus concentration of the conductive layer before the hydrophobic treatment was 2.6% by mass to 6.9% by mass had excellent results in electric conductivity, connection resistance (initial and after the reliability test), storage stability, and corrosion evaluation, compared to Examples 1, and 5 to 7.

The conductive particles of the present invention are suitably used for connecting circuit members together, such as a connection between a liquid crystal display and a tape carrier package (TCP), a connection between a flexible printed circuit (FPC) board and TCP, and a connection between FPC and a printed wiring board (PWB).

What is claimed is:

1. An anisotropic conductive film, comprising:
conductive particles; and
a binder resin,
wherein the conductive particles each contain:
a core particle; and
a conductive layer formed on a surface of the core particle,
wherein the core particle is formed of a resin, or a metal, or both thereof, and the conductive layer contains a phosphorus-containing hydrophobic group at a surface thereof,
wherein the conductive particle is produced by a method for producing conductive particles comprising treating the surface of the conductive layer formed on the surface of the core particle with a phosphorus-containing compound to give hydrophobicity, and
wherein the binder resin contains an epoxy resin, or an acrylate resin, or both thereof.

2. The anisotropic conductive film according to claim 1, further comprising at least one selected from the group consisting of a phenoxy resin, a polyester resin, and a urethane resin.

3. The anisotropic conductive film according to claim 1, further comprising a curing agent.

4. The anisotropic conductive film according to claim 1, further comprising a silane coupling agent.

5. The anisotropic conductive film according to claim 1, wherein the core particle is a resin particle, and the conductive layer is a nickel plating layer.

6. A bonded structure, comprising:
a first circuit member containing an electrode;
a second circuit member containing an electrode, provided so as to face the first circuit member; and
an anisotropic conductive film, provided between the first circuit member and the second circuit member,
wherein the anisotropic conductive film contains:
conductive particles; and
a binder resin,
wherein the conductive particles each contain:
a core particle; and
a conductive layer formed on a surface of the core particle,
wherein the core particle is formed of a resin, or a metal, or both thereof, and the conductive layer contains a phosphorus-containing hydrophobic group at a surface thereof,
wherein the conductive particle is produced by a method for producing conductive particles comprising treating the surface of the conductive layer formed on the surface of the core particle with a phosphorus-containing compound to give hydrophobicity,
wherein the binder resin contains an epoxy resin, or an acrylate resin, or both thereof, and
wherein the electrode of the first circuit member and the electrode of the second circuit member are electrically connected via the conductive particles.

7. The bonded structure according to claim 6, wherein the first circuit member is a flexible circuit board, and the second circuit member is a printed wiring board.

8. The bonded structure according to claim 6, wherein the core particle is a resin particle, and the conductive layer is a nickel plating layer.

9. A bonding method, comprising:
bonding an anisotropic conductive film, which contains conductive particles, and a binder resin, with a first circuit member containing an electrode, or a second circuit member containing an electrode;

aligning the first circuit member and the second circuit member for positioning; and electrically connecting the electrode of the first circuit member and the electrode of the second circuit member via the conductive particles, wherein the conductive particles each contain:

a core particle; and a conductive layer formed on a surface of the core particle, wherein the core particle is formed of a resin, or a metal, or both thereof, and the conductive layer contains a phosphorus-containing hydrophobic group at a surface thereof, wherein the conductive particle is produced by a method for producing conductive particles comprising treating the surface of the conductive layer formed on the surface of the core particle with a phosphorus-containing compound to give hydrophobicity, and wherein the binder resin contains an epoxy resin, or an acrylate resin, or both thereof.

10. The bonding method according to claim 9, wherein the first circuit member is a flexible circuit board, and the second circuit member is a printed wiring board.

11. The bonding method according to claim 9, wherein the core particle is a resin particle, and the conductive layer is a nickel plating layer.

12. A conductive particle, comprising;

a core particle; and a conductive layer formed on a surface of the core particle, wherein the core particle is formed of a resin, or a metal, or both thereof, and the conductive layer contains a phosphorus-containing hydrophobic group at a surface thereof, and wherein the conductive particle is produced by a method for producing conductive particles comprising treating the surface of the conductive layer formed on the surface of the core particle with a phosphorus-containing compound to give hydrophobicity.

13. The conductive particle according to claim 12, wherein the core particle is a resin particle, and the conductive layer is a nickel plating layer.

14. A method for producing conductive particles, each containing a core particle and a conductive layer formed on a surface of the core particle, the method comprising:

treating a surface of the conductive layer with a phosphorus-containing compound to give hydrophobicity, wherein the core particle is formed of a resin, or a metal, or both thereof.

15. The method according to claim 14, wherein the conductive layer has a phosphorus concentration of 10% by mass or lower before the hydrophobic treatment with the phosphorus-containing compound.

16. The method according to claim 15, wherein the conductive layer has a phosphorus concentration of 2.5% by mass to 7.0% by mass before the hydrophobic treatment with the phosphorus-containing compound.

17. The method according to claim 14, wherein the phosphorus-containing compound is a phosphoric acid compound.

18. The method according to claim 14, comprising;

forming the conductive layer containing at least phosphorus on the surface of the core particle formed of resin or a metal or both thereof, and treating the surface of the conductive layer with a phosphorus-containing compound to give hydrophobicity.

19. The method according to claim 14, comprising;

forming the conductive layer containing at least phosphorus on the surface of the core particle formed of resin or a metal or both thereof, and treating the surface of the conductive layer with a phosphorus-containing compound to give hydrophobicity wherein the conductive layer has a phosphorus concentration of 10% by mass or lower before the hydrophobic treatment with the phosphorus- containing compound.

20. The method according to claim 14, wherein the core particle is a resin particle, and the conductive layer is a nickel plating layer.

* * * * *